United States Patent
Ge et al.

(10) Patent No.: US 9,633,996 B1
(45) Date of Patent: Apr. 25, 2017

(54) HIGH DENSITY AREA EFFICIENT THIN-OXIDE DECOUPLING CAPACITOR USING CONDUCTIVE GATE RESISTOR

(71) Applicant: QUALCOMM Incorporated, San Diego, CA (US)

(72) Inventors: Lixin Ge, San Diego, CA (US); P R Chidambaram, San Diego, CA (US); Haining Yang, San Diego, CA (US); John Jianhong Zhu, San Diego, CA (US); Kern Rim, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 15/081,396

(22) Filed: Mar. 25, 2016

(51) Int. Cl.
- *H01L 27/06* (2006.01)
- *H01L 29/78* (2006.01)
- *H01L 29/06* (2006.01)
- *H01L 49/02* (2006.01)
- *H01L 29/94* (2006.01)
- *H01L 29/66* (2006.01)
- *H01L 27/07* (2006.01)

(52) U.S. Cl.
CPC ...... *H01L 27/0629* (2013.01); *H01L 27/0716* (2013.01); *H01L 28/24* (2013.01); *H01L 29/0653* (2013.01); *H01L 29/66181* (2013.01); *H01L 29/7851* (2013.01); *H01L 29/94* (2013.01)

(58) Field of Classification Search
CPC ... H01L 21/70; H01L 21/702; H01L 21/8232; H01L 27/0682; H01L 27/07; H01L 27/0711; H01L 27/0794; H01L 29/66007
See application file for complete search history.

(56) References Cited

U.S. PATENT DOCUMENTS

| | | | |
|---|---|---|---|
| 7,060,553 B2 | 6/2006 | Fried et al. |
| 8,446,175 B2 | 5/2013 | Aton |
| 8,796,745 B2 | 8/2014 | Kocon |
| 8,815,661 B1 | 8/2014 | Basker et al. |
| 9,142,548 B2 | 9/2015 | Zhang et al. |

*Primary Examiner* — Cheung Lee
(74) *Attorney, Agent, or Firm* — Seyfarth Shaw LLP (57) ABSTRACT

A semiconductor device arranged between a source voltage (Vss) and a power voltage (Vdd) may include a first terminal coupled to the power voltage Vdd. The semiconductor device may also include a decoupling capacitor. The decoupling capacitor may include a semiconductor fin coupled to the first terminal, a dielectric layer on the semiconductor fin, and a gate on the dielectric layer. The semiconductor device may further include a second terminal. The second terminal may include a conductive gate resistor coupled in series with the gate of the decoupling capacitor. The second terminal may be coupled to the source voltage Vss via a first interconnect layer (M1).

25 Claims, 9 Drawing Sheets

HIGH DENSITY AREA EFFICIENT THIN-OXIDE DECOUPLING CAPACITOR USING CONDUCTIVE GATE RESISTOR

BACKGROUND

Field

Aspects of the present disclosure relate to semiconductor devices, and more particularly to a high density, area efficient thin-oxide decoupling capacitor using a conductive gate resistor.

Background

Capacitors are passive elements used in integrated circuits for storing an electrical charge. Capacitors are often made using plates or structures that are conductive with an insulating material between the plates. The amount of storage, or capacitance, for a given capacitor is contingent upon the materials used to make the plates and the insulator, the area of the plates, and the spacing between the plates. The insulating material is often a dielectric material. Metal-insulator-metal (MIM) capacitors are one example of a parallel plate capacitor, in which the insulator is the dielectric, and the plates are made of a metal material.

Parallel plate capacitors are frequently employed in semiconductor dies to provide capacitance to circuitry on the semiconductor die. Parallel plate capacitors are increasingly used to improve performance of devices that operate at increasingly higher frequencies. For example, parallel plate capacitors may be added to semiconductor dies having radio frequency (RF) circuitry to provide bypass capacitance. This usage of a capacitor may be referred to as a decoupling capacitor. A decoupling capacitor is a capacitor that decouples one portion of a circuit (e.g., an electrical network) from another portion of the circuit. In this arrangement, noise generated by other portions of the circuit is shunted through the capacitor, which reduces the effect of the noise on the remaining portions of the circuit. That is, a decoupling capacitor may be used to bypass a power supply or other high impedance component of the circuit.

The fabrication of decoupling capacitors, however, usually increases the cost of producing a semiconductor die by, for example, increasing the number of processing steps and increasing the number of masks to produce a die. In addition, gate leakage of decoupling capacitors (e.g., due to oxide thickness) becomes a significant problem at advanced process nodes.

SUMMARY

A semiconductor device arranged between a source voltage (Vss) and a power voltage (Vdd) may include a first terminal coupled to the power voltage Vdd. The semiconductor device may also include a decoupling capacitor. The decoupling capacitor may include a semiconductor fin coupled to the first terminal, a dielectric layer on the semiconductor fin, and a gate on the dielectric layer. The semiconductor device may further include a second terminal. The second terminal may include a conductive gate resistor coupled in series with the gate of the decoupling capacitor. The second terminal may be coupled to the source voltage Vss via a first interconnect layer (M1).

A method of making a decoupling capacitor may include depositing a dielectric layer on a semiconductor fin supported by a substrate. The method may also include depositing a first conductive material on the dielectric layer as a gate of the decoupling capacitor. The method may further include fabricating a conductive gate resistor in a first interlayer dielectric within a middle-of-line layer, the conductive gate resistor coupled in series with the gate of the decoupling capacitor. The method may also include depositing a second conductive material on the first interlayer dielectric as a first interconnect layer M1 coupled in series with the conductive gate resistor.

A semiconductor device arranged between a source voltage (Vss) and a power voltage (Vdd) may include a first terminal coupled to the power voltage Vdd. The semiconductor device may also include means for capacitive decoupling coupled to the first terminal. The semiconductor device may further include a second terminal. The second terminal may include a conductive gate resistor coupled in series with the capacitive decoupling means. The second terminal may be coupled to the source voltage Vss via a first interconnect layer (M1).

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of an aspect of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Parallel plate capacitors are frequently employed in semiconductor dies to provide capacitance to circuitry on the semiconductor die. In addition, parallel plate capacitors are increasingly used to improve performance of devices that operate at increasingly higher frequencies. For example, parallel plate capacitors may be added to semiconductor dies having radio frequency (RF) circuitry to provide bypass capacitance. This usage of a capacitor may be referred to as a decoupling capacitor. A decoupling capacitor is a capacitor that decouples one portion of a circuit (e.g., an electrical network) from another portion of the circuit. In this arrangement, noise generated by other portions of the circuit is shunted through the capacitor, which reduces the effect of the noise on the remaining portions of the circuit. That is, a decoupling capacitor may be used to bypass a power supply or other high impedance component of the circuit.

Decoupling capacitors may be arranged at different levels (e.g., on-board, on-package, on-die, etc.) to collectively reduce dynamic voltage noise of different frequencies. On-die metal-insulator-metal (MIM) or poly-insulator-poly decoupling capacitors, however, generally consume a large die area. In addition, the fabrication of these decoupling capacitors usually increases the cost of producing a semiconductor die by, for example, increasing the number of processing steps and increasing the number of masks used to produce the die. As a result, metal oxide semiconductor (MOS) transistor-based decoupling capacitors are widely used for on-die decoupling because they are easily inserted close to the nodes that exhibit large inductance noise.

Unfortunately, electrostatic discharge (ESD) damage on gate oxide, especially on thin gate oxide, and gate leakage of MOS-based decoupling capacitors (e.g., due to oxide thickness) becomes a significant problem at advanced process nodes. One methodology to reduce ESD damage on gate oxide and decoupling capacitor leakage is using a dielectric material with reduced ESD damage and leakage, which may be unavailable. Another method for reducing ESD damage and decoupling capacitor leakage is using thick oxide MOS transistors in chip designs, which consume increased chip area. In addition, the fabrication of thick oxide decoupling capacitors increases the cost of producing the semiconductor die.

Semiconductor fabrication processes are often divided into three parts: a front-end-of-line (FEOL), a middle-of-line (MOL) and a back-end-of-line (BEOL). Front-end-of-line processes include wafer preparation, isolation, well formation, gate patterning, spacers, and dopant implantation. A middle-of-line process includes gate and terminal contact formation. The gate and terminal contact formation of the middle-of-line process, however, is an increasingly challenging part of the fabrication flow, particularly for lithography patterning. Back-end-of-line processes include forming interconnects and dielectric layers for coupling to the FEOL devices. These interconnects may be fabricated with a dual damascene process using plasma-enhanced chemical vapor deposition (PECVD) deposited inter-layer dielectric (ILD) materials.

More recently, the number of interconnect levels for circuitry has substantially increased due to the large number of transistors that are now interconnected in a modern microprocessor. The increased number of interconnect levels for supporting the increased number of transistors involves more intricate middle-of-line processes to perform the gate and terminal contact formation.

In particular, advances in lithography have reduced line spacing to less than twenty (20) nanometers on integrated circuit chips. The use of the reduced line spacing increases the available area for capacitance because more lines of charge storage can be placed in the same volume of material. Further, the use of middle-of-line interconnect structures, as described in one aspect of the present disclosure, allows for an improved decoupling capacitor structure.

As described herein, the middle-of-line interconnect layers may refer to the conductive interconnects for connecting a first interconnect layer (e.g., metal 1 (M1)) to an oxide diffusion (OD) layer of an integrated circuit as well for connecting M1 to the active devices of the integrated circuit. The middle-of-line interconnect layers for connecting M1 to the OD layer of an integrated circuit may be referred to as "MD1" and "MD2," collectively referred to herein as "MD interconnects." The middle-of-line interconnect layer for connecting M1 to the polysilicon gates of an integrated circuit may be referred to as "MP," or "MP interconnects." In more advance process nodes, MD interconnects are referred to as source/drain trench interconnects (CA), and the MP interconnects are referred to as gate interconnects (CB). In addition, these MOL interconnects may be coupled to the first interconnect layer through a zero via (V0).

One aspect of the present disclosure describes a high density, area efficient thin-oxide decoupling capacitor using a conductive gate resistor. This aspect of the present disclosure describes a semiconductor device including a decoupling capacitor that may be arranged between a source voltage (Vss) and a power voltage (Vdd). The semiconductor device may include a first terminal coupled to Vdd. The decoupling capacitor may include a semiconductor fin coupled to the first terminal, a dielectric layer on the semiconductor fin, and a gate on the dielectric layer. The semiconductor device also includes a second terminal composed of a conductive gate resistor coupled in series to the decoupling capacitor. The second terminal is coupled to Vss through a first interconnect layer (M1).

The semiconductor device may further include a first contact coupling the conductive gate resistor to the gate at a first end of the conductive gate resistor and a second contact coupling a second end of the conductive gate resistor to a first interconnect layer (M1) coupled to Vss. The first contact and/or the second contact may be source/drain trench interconnects (CA) and/or gate interconnects (CB). In addition, the conductive gate resistor may be disposed within a middle-of-line (MOL) interconnect layer between a substrate supporting the semiconductor fin and the first interconnect layer M1. Also, the conductive gate resistor may be composed of titanium nitride, and/or a middle-of-line (MOL) compatible material, such as a high resistive gate material. Likewise, the conductive gate may be a high-K metal gate (HKMG). In addition, the semiconductor device may include a shallow trench isolation (STI) region surrounding the semiconductor fin and an interlayer dielectric (ILD) on the STI and at least the conductive gate resistor.

Formation of the conductive gate resistor in the MOL interconnect layer enables formation of a decoupling capacitor without using a resistor that is formed in the first interconnect layer M1. Conventional resistors for decoupling capacitors are formed in the first interconnect layer M1, such as an M1 metal mesh resistor, to provide a specified resistance. Such resistors, however, occupy a larger area that results in an area/routing penalty to achieve the specified resistance. Forming a conductive gate resistor in the MOL interconnect layer, however, enables the usage of an MOL compatible material such as of titanium nitride or other like high resistive gate material (e.g., a high-K metal gate (HKMG) material). Formation in the MOL interconnect layer also avoids the area/routing penalty associated with conventional M1 metal mesh resistors, while providing a two to five times (2-5×) increase in the capacitance density of the decoupling capacitor.

Figure 1:
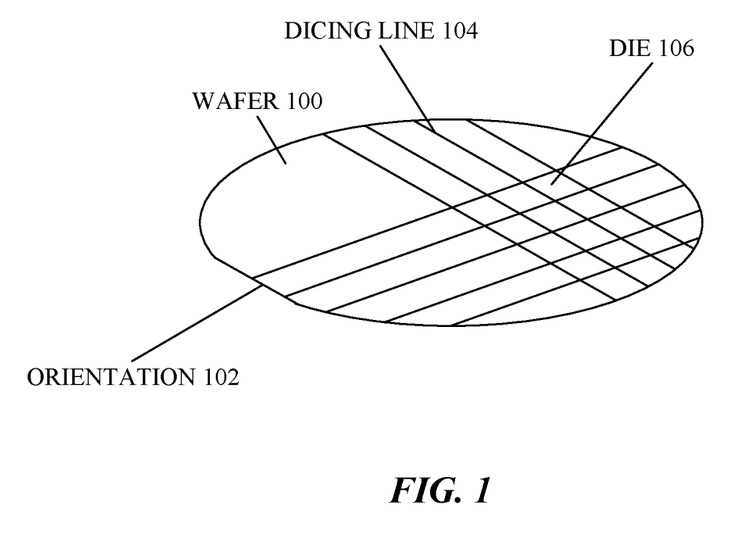
FIG. 1 illustrates a perspective view of a semiconductor wafer in an aspect of the present disclosure.

FIG. 1 illustrates a perspective view of a semiconductor wafer in an aspect of the present disclosure. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystalizes onto the seed crystal in the orientation of the crystal.

The wafer 100 may be a compound material, such as gallium arsenide (GaAs) or gallium nitride (GaN), a ternary material such as indium gallium arsenide (InGaAs), quaternary materials, or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

The Miller Indices form a notation system of the crystallographic planes in crystal lattices. The lattice planes may be indicated by three integers h, k, and l, which are the Miller indices for a plane (hkl) in the crystal. Each index denotes a plane orthogonal to a direction (h, k, l) in the basis of the reciprocal lattice vectors. The integers are usually written in lowest terms (e.g., their greatest common divisor should be 1). Miller index 100 represents a plane orthogonal to direction h; index 010 represents a plane orthogonal to direction k, and index 001 represents a plane orthogonal to l. For some crystals, negative numbers are used (written as a bar over the index number) and for some crystals, such as gallium nitride, more than three numbers may be employed to adequately describe the different crystallographic planes.

Once the wafer 100 has been processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
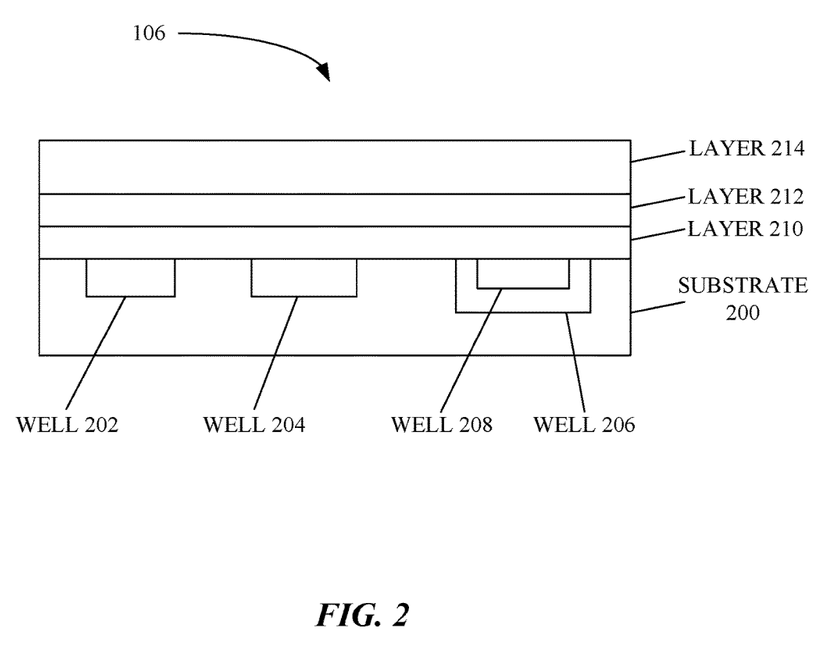
FIG. 2 illustrates a cross-sectional view of a die in accordance with an aspect of the present disclosure.

FIG. 2 illustrates a cross-sectional view of a die 106 in accordance with an aspect of the present disclosure. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200.

Within a substrate 200 (e.g., a semiconductor substrate), there may be wells 202 and 204, which may be the source and/or drain of a field-effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT). The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure.

Figure 3:
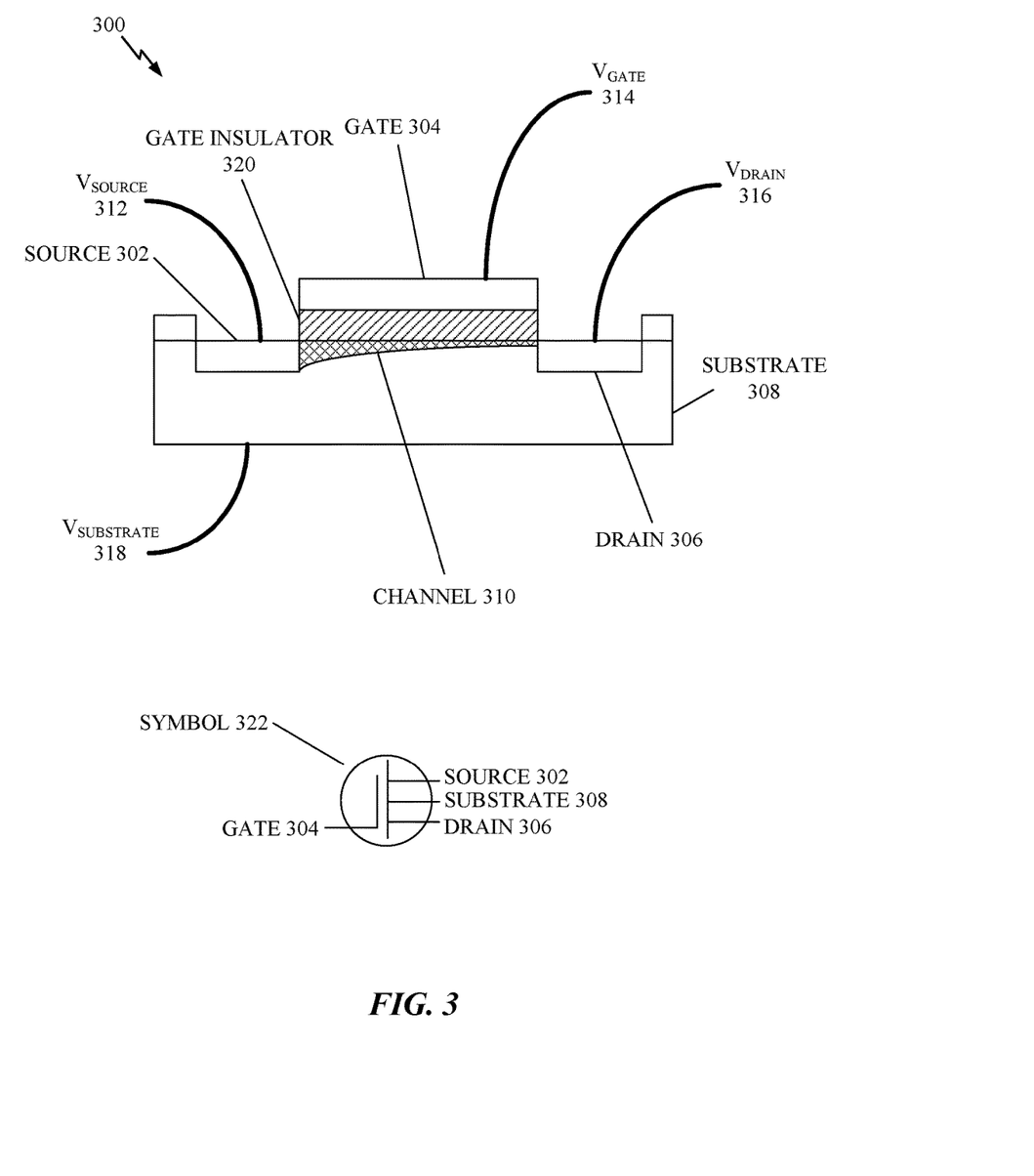
FIG. 3 illustrates a cross-sectional view of a metal-oxide-semiconductor field-effect transistor (MOSFET) device in an aspect of the present disclosure.

FIG. 3 illustrates a cross-sectional view of a metal-oxide-semiconductor field-effect transistor (MOSFET) device 300 in an aspect of the present disclosure. The MOSFET device 300 may have four input terminals. The four inputs are a source 302, a gate 304, a drain 306, and a substrate 308. The source 302 and the drain 306 may be fabricated as the wells 202 and 204 in the substrate 308, or may be fabricated as areas above the substrate 308, or as part of other layers on the die 106. Such other structures may be a fin or other structure that protrudes from a surface of the substrate 308. Further, the substrate 308 may be the substrate 200 on the die 106, but substrate 308 may also be one or more of the layers (e.g., 210-214) that are coupled to the substrate 200.

The MOSFET device 300 is a unipolar device, as electrical current is produced by only one type of charge carrier (e.g., either electrons or holes) depending on the type of MOSFET. The MOSFET device 300 operates by controlling the amount of charge carriers in the channel 310 between the source 302 and the drain 306. A voltage Vsource 312 is applied to the source 302, a voltage Vgate 314 is applied to the gate 304, and a voltage Vdrain 316 is applied to the drain 306. A separate voltage Vsubstrate 318 may also be applied to the substrate 308, although the voltage Vsubstrate 318 may be coupled to one of the voltage Vsource 312, the voltage Vgate 314 or the voltage Vdrain 316.

To control the charge carriers in the channel 310, the voltage Vgate 314 creates an electric field in the channel 310 when the gate 304 accumulates charges. The opposite charge to that accumulating on the gate 304 begins to accumulate in the channel 310. The gate insulator 320 insulates the charges accumulating on the gate 304 from the source 302, the drain 306, and the channel 310. The gate 304 and the channel 310, with the gate insulator 320 in between, create a capacitor, and as the voltage Vgate 314 increases, the charge carriers on the gate 304, acting as one plate of this capacitor, begin to accumulate. This accumulation of charges on the gate 304 attracts the opposite charge carriers into the channel 310. Eventually, enough charge carriers are accumulated in the channel 310 to provide an electrically conductive path between the source 302 and the drain 306. This condition may be referred to as opening the channel of the FET.

By changing the voltage Vsource 312 and the voltage Vdrain 316, and their relationship to the voltage Vgate 314, the amount of voltage applied to the gate 304 that opens the channel 310 may vary. For example, the voltage Vsource 312 is usually of a higher potential than that of the voltage Vdrain 316. Making the voltage differential between the voltage Vsource 312 and the voltage Vdrain 316 larger will change the amount of the voltage Vgate 314 used to open the channel 310. Further, a larger voltage differential will change the amount of electromotive force moving charge carriers through the channel 310, creating a larger current through the channel 310.

The gate insulator 320 material may be silicon oxide, or may be a dielectric or other material with a different dielectric constant (k) than silicon oxide. Further, the gate insulator 320 may be a combination of materials or different layers of materials. For example, the gate insulator 320 may be Aluminum Oxide, Hafnium Oxide, Hafnium Oxide Nitride, Zirconium Oxide, or laminates and/or alloys of these materials. Other materials for the gate insulator 320 may be used without departing from the scope of the present disclosure.

By changing the material for the gate insulator 320, and the thickness of the gate insulator 320 (e.g., the distance between the gate 304 and the channel 310), the amount of charge on the gate 304 to open the channel 310 may vary. A symbol 322 showing the terminals of the MOSFET device 300 is also illustrated. For N-channel MOSFETs (using electrons as charge carriers in the channel 310), an arrow is applied to the substrate 308 terminal in the symbol 322 pointing away from the gate 304 terminal. For p-type MOSFETs (using holes as charge carriers in the channel 310), an arrow is applied to the substrate 308 terminal in the symbol 322 pointing toward the gate 304 terminal.

The gate 304 may also be made of different materials. In some designs, the gate 304 is made from polycrystalline silicon, also referred to as polysilicon or poly, which is a conductive form of silicon. Although referred to as "poly" or "polysilicon" herein, metals, alloys, or other electrically conductive materials are contemplated as appropriate materials for the gate 304 as described in the present disclosure.

In some MOSFET designs, a high-k value material may be desired in the gate insulator 320, and in such designs, other conductive materials may be employed. For example, and not by way of limitation, a "high-k metal gate" design may employ a metal, such as copper, for the gate 304 terminal. Although referred to as "metal," polycrystalline materials, alloys, or other electrically conductive materials are contemplated as appropriate materials for the gate 304 as described in the present disclosure.

To interconnect to the MOSFET device 300, or to interconnect to other devices in the die 106 (e.g., semiconductor), interconnect traces or layers are used. These interconnect traces may be in one or more of layers (e.g., 210-214), or may be in other layers of the die 106.

Figure 4:
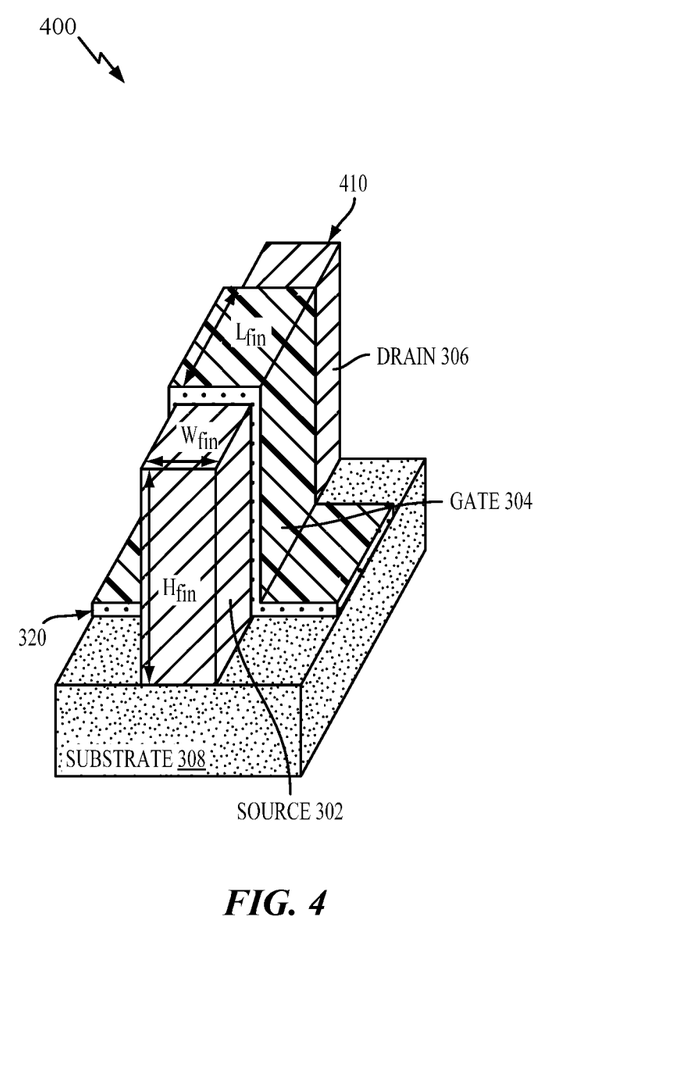
FIG. 4 illustrates a fin field effect transistor (FinFET) in accordance with an aspect of the present disclosure.

FIG. 4 illustrates a transistor in accordance with an aspect of the present disclosure. A fin-structured FET (FinFET 400) operates in a similar fashion to the MOSFET device 300 described with respect to FIG. 3. A fin 410 in a FinFET 400, however, is grown or otherwise coupled to the substrate 308. The substrate 308 may be a semiconductor substrate or other like supporting layer, for example, comprised of an oxide layer, a nitride layer, a metal oxide layer or a silicon layer. The fin 410 includes the source 302 and the drain 306. A gate 304 is disposed on the fin 410 and on the substrate 308 through a gate insulator 320. A height, Hfin, a width, Wfin, and a length, Lfin, represent the dimensions of the fin. In a FinFET structure, the physical size of the FinFET 400 may be smaller than the MOSFET device 300 structure shown in FIG. 3. This reduction in physical size allows for more devices per unit area on the die 106.

Decoupling Capacitor Using a Conductive Gate Resistor

A decoupling capacitor is a capacitor that decouples one portion of a circuit (e.g., an electrical network) from another portion of the circuit. In this arrangement, noise generated by other portions of the circuit is shunted through the capacitor, which reduces the effect of the noise on the remaining portions of the circuit. That is, a decoupling capacitor may be used to bypass a power supply or other high impedance component of the circuit.

Decoupling capacitors may be arranged at different levels (e.g., on-board, on-package, on-die, etc.) to collectively reduce dynamic voltage noise of different frequencies. On-die metal-insulator-metal (MIM) or poly-insulator-poly decoupling capacitors, however, generally consume a large die area. In addition, gate leakage of metal oxide semiconductor (MOS)-based decoupling capacitors (e.g., due to oxide thickness) becomes a significant problem at advanced process nodes. One methodology for reducing decoupling capacitor leakage employs a dielectric material with reduced leakage, which may be unavailable. Another method for reducing decoupling capacitor leakage is using thick oxide MOS transistors in chip designs, which consume an increased chip area. In addition, the fabrication of thick oxide decoupling capacitors increases the cost of producing the semiconductor die.

Figure 5A:
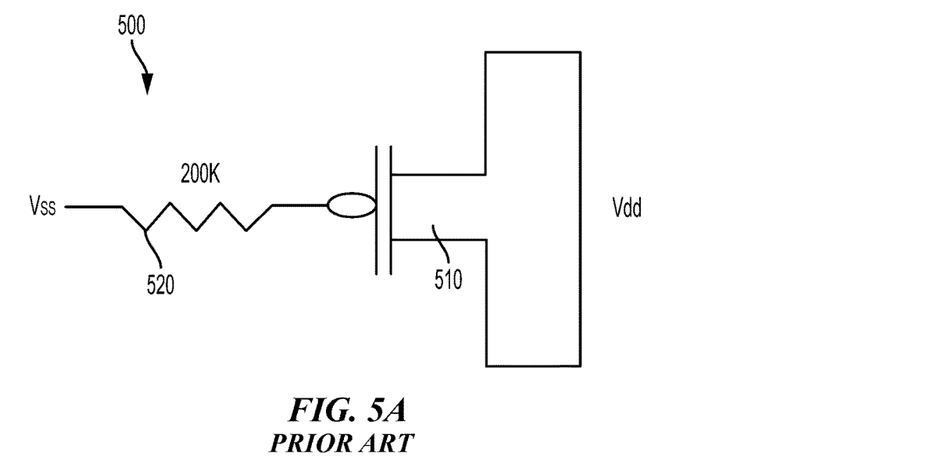
FIGS. 5A and 5B illustrate a conventional p-type field effect transistor (PFET)-based decoupling capacitor.
Figure 5B:
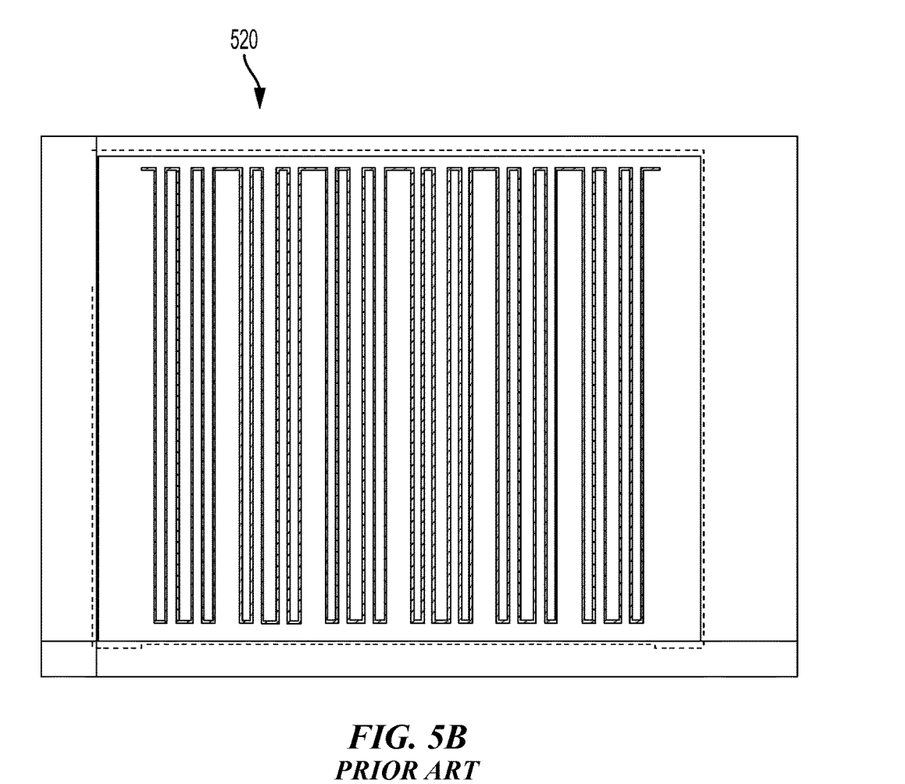

FIGS. 5A and 5B illustrate a conventional p-type field effect transistor (PFET)-based edge decoupling capacitor. Representatively, the PFET-based edge decoupling capacitor 500 is a low frequency edge decoupling capacitor built with a long channel PFET 510. In this arrangement, the long channel PFET 510, the source, body, and drain nodes are tied together to the power voltage Vdd. The gate of the long channel PFET is tied to a resistor. A knee frequency (e.g., an estimate of the highest frequency content of the signal) of the PFET-based edge decoupling capacitor 500 (e.g., around 100 megahertz (MHz)) may be controlled by an equivalent series resistance (ESR) using a first interconnect layer (M1) conductive mesh resistor 520, as illustrated in FIG. 5B.

FIG. 5B illustrates an overhead view of a first interconnect layer M1 conductive mesh resistor 520. This conventional resistor of the PFET-based edge decoupling capacitor 500 is formed in the first interconnect layer M1 as an M1 metal mesh resistor, to provide a specified resistance. In particular, an equivalent series resistance ESR (e.g. 200 k) of the M1 conductive mesh resistor 520 enables control of the knee frequency of the PFET-based edge decoupling capacitor 500. In practice, decoupling capacitors are built using M1 metal mesh resistors with differing equivalent series resistance ESR to target different knee frequencies. Such M1 metal mesh resistors, however, occupy a larger area that results in an area/routing penalty to achieve the specified resistance.

Forming a conductive gate resistor in a middle-of-line (MOL) interconnect layer, however, enables the uses of a MOL compatible material, such as of titanium nitride or other like high resistive gate material (e.g., a high-K metal gate (HKMG material). Formation in the MOL interconnect layer also avoids the area/routing penalty associated with conventional M1 metal mesh resistors, while providing a two to five times (2-5×) increase in the capacitance density of the decoupling capacitor. That is, formation of a conductive gate resistor in the MOL interconnect, layer enables formation of a thin-oxide decoupling capacitor without electrostatic discharge (ESD) or reliability issues.

Figure 6:
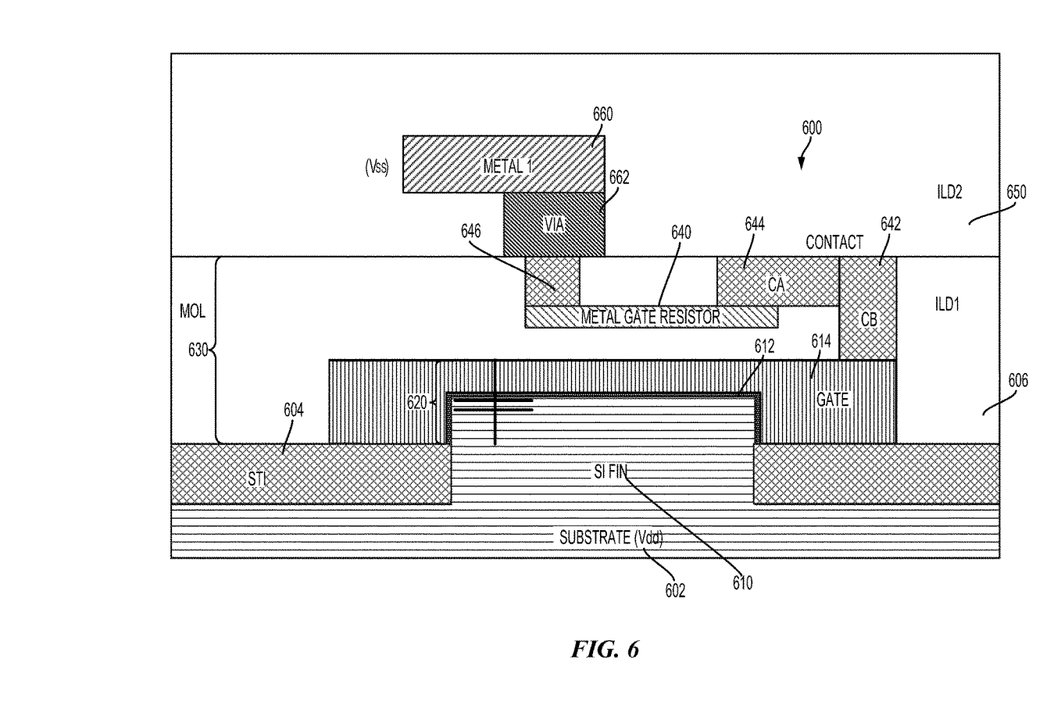
FIG. 6 illustrates a cross-sectional view of a high density, area efficient thin-oxide decoupling capacitor using a conductive gate resistor in accordance with an aspect of the present disclosure.

FIG. 6 illustrates a cross-sectional view of a semiconductor device 600 including a high density, area efficient thin-oxide decoupling capacitor using a conductive gate resistor in accordance with an aspect of the present disclosure. In this aspect of the present disclosure, the semiconductor device 600 includes a decoupling capacitor 620 that may be arranged between a source voltage (Vss) and a power voltage (Vdd). The semiconductor device 600 may include a first terminal coupled to Vdd. In one arrangement, a semiconductor substrate 602 provides the first terminal coupled to Vdd. The decoupling capacitor 620 may include a semiconductor fin 610 coupled to the first terminal, a dielectric layer 612 on the semiconductor fin 610, and a gate 614 on the dielectric layer 612. The semiconductor device 600 also includes a second terminal composed of a conductive gate resistor 640 coupled in series to the decoupling capacitor 620. The second terminal is coupled to Vss through a first interconnect layer M1 660 and a zero via 662 (V0).

In the arrangement shown in FIG. 6, both the conductive gate resistor 640 and the decoupling capacitor 620 are provided in an MOL interconnect layer 630 between the semiconductor substrate 602 and the first interconnect layer M1 660. This arrangement within the MOL interconnect layer enables formation of the decoupling capacitor 620 without using a resistor formed in the first interconnect layer M1, such as the M1 conductive mesh resistor 520 shown in FIGS. 5A and 5B. As noted above, these conventional resistors are formed in the first interconnect layer M1 to provide a specified equivalent series ESR for controlling a knee frequency of conventional decoupling capacitors. By contrast, forming the conductive gate resistor 640 in the MOL interconnect layer 630 enables the uses of an MOL compatible material such as titanium nitride, tungsten or other like high resistive gate material (e.g., a high-K metal gate (HKMG material). Formation in the MOL interconnect layer enables a sufficient equivalent series resistance ESR while also avoiding the area/routing penalty associated with conventional M1 metal mesh resistors.

As further illustrated in FIG. 6, the semiconductor device 600 may include a gate interconnect 642 (CB) coupled to the gate 614 as well as a first trench interconnect 644 (CA) coupling a first end of the conductive gate resistor 640 to the gate 614 of the decoupling capacitor 620. In this arrangement, the second end of the conductive gate resistor 640 is distal from the first end. In addition, a second trench interconnect 646 couples a second end of the conductive gate resistor 640 to the first interconnect layer M1 660, coupled to Vss, through a zero via 662 (V0). The first and second trench interconnects CA and the gate interconnects CB may be tungsten. The first and second trench interconnects CA may be formed according to a first trench interconnect pattern or a second trench interconnect pattern. In addition, the gate interconnect 642 (CB) may be formed according to a gate interconnect pattern.

In this aspect of the present disclosure, the conductive gate resistor 640 is composed of a MOL compatible material, such as a high resistive gate material. Likewise, the gate 614 may be a high-K metal gate (HKMG). In this arrangement, the semiconductor device 600 may include shallow trench isolation (STI) region 604 surrounding the semiconductor fin 610, and a first interlayer dielectric (ILD) 606 on the STI and at least the conductive gate resistor 640 as well as the other elements in the MOL layer. A second interlayer dielectric 650 may be arranged on the first interlayer dielectric 606.

Figure 7:
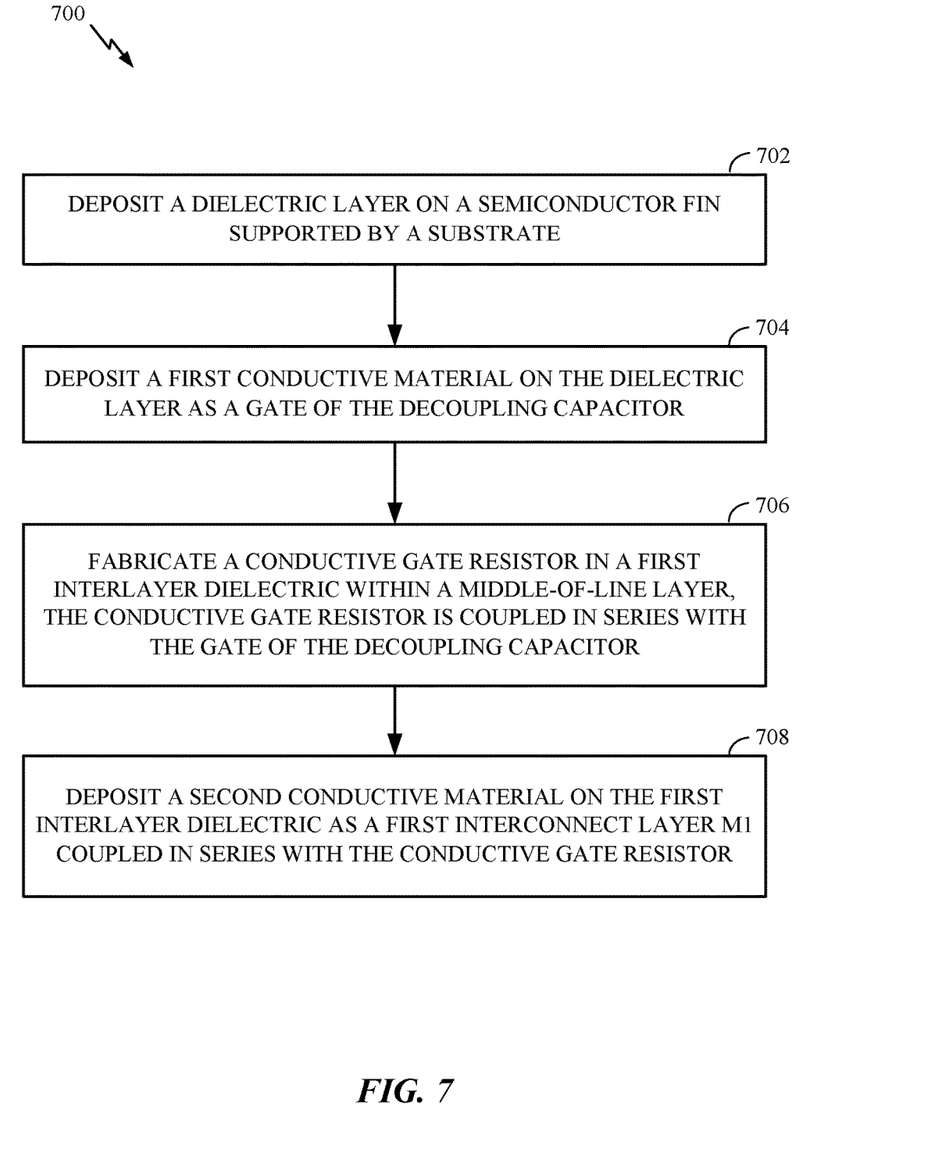
FIG. 7 illustrates a method of a fabricating fin-based decoupling capacitor structure in accordance with an aspect of the present disclosure.

FIG. 7 illustrates a method 700 of making a fin-based decoupling capacitor structure according to an aspect of the present disclosure. In block 702, a dielectric layer is deposited on a semiconductor fin supported by a substrate. As shown in FIG. 6, the dielectric layer 612 is deposited on the semiconductor fin 610 supported by the semiconductor substrate 602. In block 704, a first conductive material is deposited on the dielectric layer as a gate of the decoupling capacitor. As shown in FIG. 6, the first interlayer dielectric 606 is etched according to a gate pattern to expose the STI region 604 and the dielectric layer 612. Once exposed, a high-K conductive material is deposited on an exposed portion of the dielectric layer 612 and the STI region 604 according to the gate pattern. Depositing of the first conductive material to form the gate 614 completes the formation of the decoupling capacitor 620.

Referring again to FIG. 7, in block 706, a conductive gate resistor is fabricated in a first interlayer dielectric within a middle-of-line layer. The conductive gate resistor is coupled in series with the gate of the decoupling capacitor. As shown in FIG. 6, the first interlayer dielectric 606 may be etched according to a conductive resistor pattern. Once etched, an MOL compatible resistive material (e.g., titanium nitride) is deposited according to the conductive resistor pattern as to form the conductive gate resistor 640. In block 708, a second conductive material is deposited on the first interlayer dielectric as a first interconnect layer M1 coupled in series with the conductive gate resistor. As shown in FIG. 6, the second interlayer dielectric 650 (ILD2) may be etched according to a zero via pattern to expose the second trench interconnect 646. Once exposed, a third conductive material (e.g. copper) is deposited on an exposed portion of the second trench interconnect to form the via 662 (e.g., a zero via (V0)) coupling the second trench interconnect 646 to the first interconnect layer M1 660.

According to an aspect of the present disclosure, a fin-based decoupling capacitor structure is described. In one configuration, the fin-based decoupling structure includes means for capacitive decoupling coupled to the first terminal. The fin-based decoupling structure also includes a second terminal comprising a conductive gate resistor coupled in series with the capacitive decoupling means, the second terminal is coupled to Vss via a first interconnect layer (M1) The capacitive decoupling means may be the decoupling capacitor 620. In another aspect, the aforementioned means may be any module or any apparatus or material configured to perform the functions recited by the aforementioned means.

Formation of a conductive gate resistor in a middle-of-line interconnect layer enables formation of a decoupling capacitor without using a resistor formed in a first interconnect layer M1. Conventional resistors for decoupling capacitors are formed in the first interconnect layer M1 (e.g., an M1 metal mesh resistor) to provide a specified resistance. Such resistors, however, occupy a larger area that results in an area/routing penalty to achieve the specified resistance. Forming a conductive gate resistor in the MOL interconnect layer enables the uses of an MOL compatible material such as titanium nitride or other like high resistive gate material (e.g., a high-K metal gate (HKMG material). In addition, formation in the MOL interconnect layer also avoids the area/routing penalty associated with conventional M1 metal mesh resistors, while providing a two to five times (2-5×) increase in the capacitance density of the decoupling capacitor.

Figure 8:
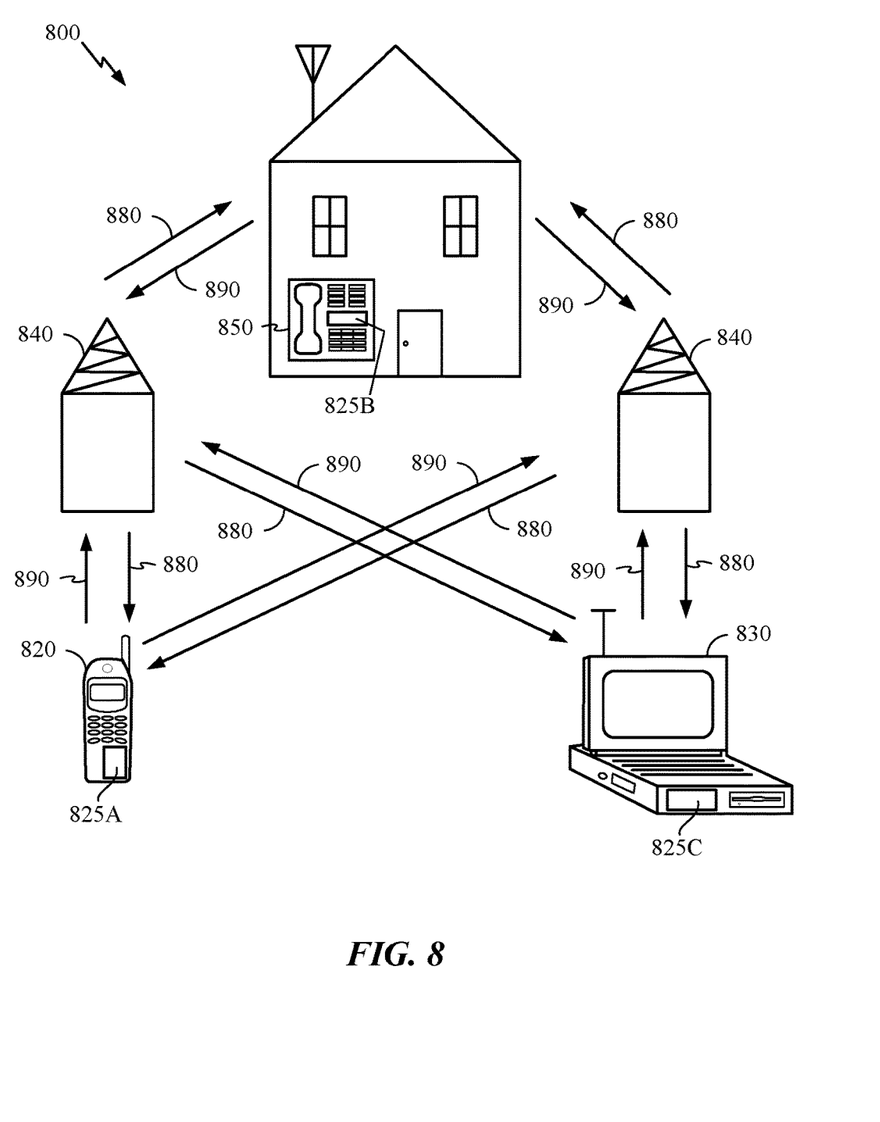
FIG. 8 is a block diagram showing an exemplary wireless communication system in which an aspect of the disclosure may be advantageously employed.

FIG. 8 is a block diagram showing an exemplary wireless communication system 800 in which an aspect of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825C, and 825B that include the disclosed decoupling capacitors. It will be recognized that other devices may also include the disclosed decoupling capacitors, such as the base stations, switching devices, and network equipment. FIG. 8 shows forward link signals 880 from the base station 840 to the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be a mobile phone, a hand-held personal communication systems (PCS) unit, a portable data unit such as a personal data assistant, a GPS enabled device, a navigation device, a set top box, a music player, a video player, an entertainment unit, a fixed location data unit such as a meter reading equipment, or other devices that store or retrieve data or computer instructions, or combinations thereof. Although FIG. 8 illustrates remote units according to the aspects of the disclosure, the disclosure is not limited to these exemplary illustrated units. Aspects of the disclosure may be suitably employed in many devices, which include the disclosed decoupling capacitors.

Figure 9:
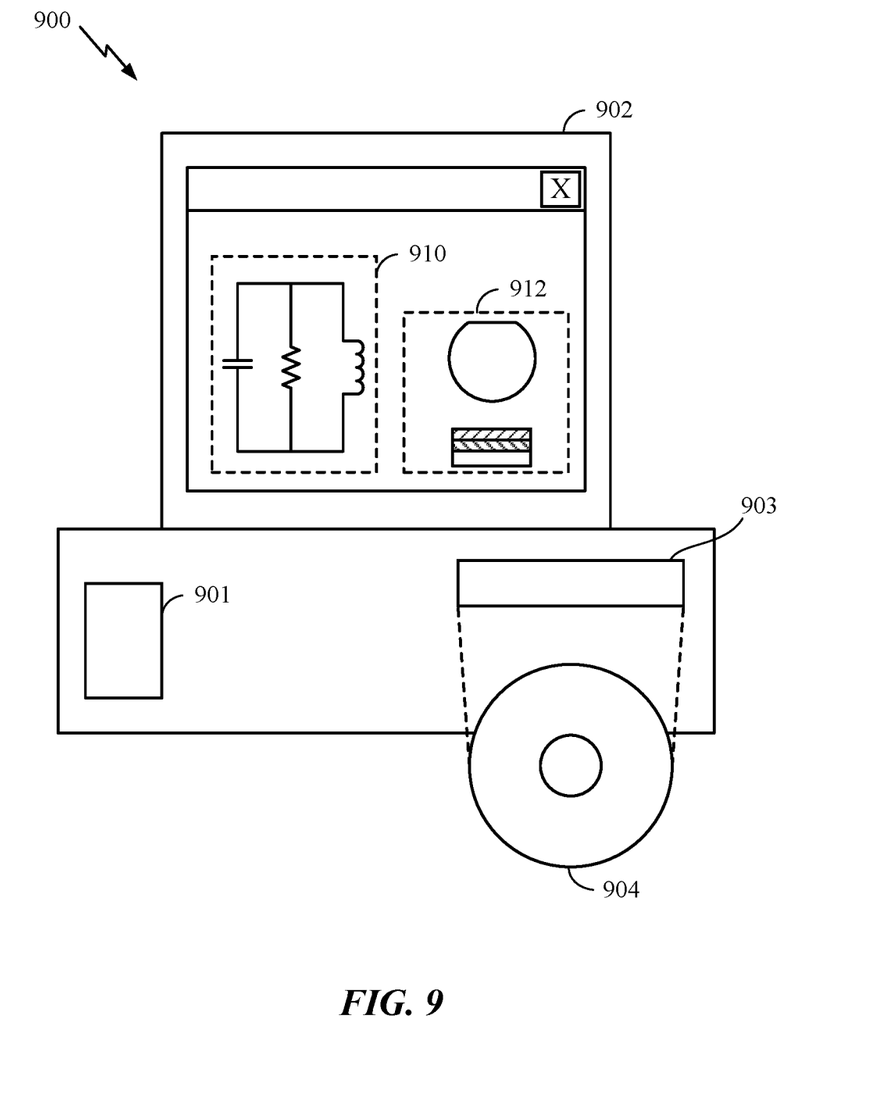
FIG. 9 is a block diagram illustrating a design workstation used for circuit, layout, and logic design of a fin-based structure according to one configuration

FIG. 9 is a block diagram illustrating a design workstation used for circuit, layout, and logic design of a fin-based structure, such as the decoupling capacitor devices disclosed above. A design workstation 900 includes a hard disk 901 containing operating system software, support files, and design software such as Cadence or OrCAD. The design workstation 900 also includes a display 902 to facilitate design of a circuit 910 or a decoupling capacitor structure 912 such as a decoupling capacitor. A storage medium 904 is provided for tangibly storing the design of the circuit 910 or the decoupling capacitor structure 912. The design of the circuit 910 or the decoupling capacitor structure 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit 910 or the fin-based structure 912 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A semiconductor device between a source voltage (Vss) and a power voltage (Vdd), comprising:
    a first terminal coupled to Vdd;
    a decoupling capacitor comprising a semiconductor fin coupled to the first terminal, a dielectric layer on the semiconductor fin, and a gate on the dielectric layer; and
    a second terminal comprising a conductive gate resistor coupled in series with the gate of the decoupling capacitor, the second terminal coupled to Vss via a first interconnect layer (M1).

2. The semiconductor device of claim 1, in which the first terminal comprises a substrate coupled to Vdd and supporting the semiconductor fin.

3. The semiconductor device of claim 1, further comprising:
    a gate interconnect coupled to the gate of the decoupling capacitor;
    a first trench interconnect coupling a first end of the conductive gate resistor to the gate interconnect; and
    a second trench interconnect coupling a second end of the conductive gate resistor to the first interconnect layer (M1) coupled to Vdd.

4. The semiconductor device of claim 3, in which the second trench interconnect is coupled to the first interconnect layer (M1) through a zero via (V0).

5. The semiconductor device of claim 1, in which the conductive gate resistor and the decoupling capacitor are arranged in a middle-of-line (MOL) interconnect layer between a substrate supporting the semiconductor fin and the first interconnect layer (M1).

6. The semiconductor device of claim 1, in which the conductive gate resistor comprises titanium nitride.

7. The semiconductor device of claim 1, in which the gate comprises a high-K metal gate (HKMG)).

8. The semiconductor device of claim 1, further comprising:
    a shallow trench isolation (STI) region surrounding the semiconductor fin; and
    an interlayer dielectric (ILD) on the STI and at least the conductive gate resistor.

9. The semiconductor device of claim 1, integrated into a mobile phone, a set top box, a music player, a video player, an entertainment unit, a navigation device, a computer, a hand-held personal communication systems (PCS) unit, a portable data unit, and/or a fixed location data unit.

10. A method of making a decoupling capacitor, comprising:
    depositing a dielectric layer on a semiconductor fin supported by a substrate;
    depositing a first conductive material on the dielectric layer as a gate of the decoupling capacitor;
    fabricating a conductive gate resistor in a first interlayer dielectric within a middle-of-line layer, the conductive gate resistor coupled in series with the gate of the decoupling capacitor; and
    depositing a second conductive material on the first interlayer dielectric as a first interconnect layer (M1) coupled in series with the conductive gate resistor.

11. The method of claim 10, further comprising:
    etching the first interlayer dielectric according to a gate interconnect pattern to expose the gate of the decoupling capacitor;
    depositing a third conductive material on an exposed portion of the gate of the decoupling capacitor according to the gate interconnect pattern as a gate interconnect.

12. The method of claim 10, further comprising:
    etching the first interlayer dielectric according to a first trench interconnect pattern to expose a first end of the conductive gate resistor;
    depositing a third conductive material on the first end of the conductive gate resistor as a first trench interconnect coupling the first end of the conductive gate resistor to a gate interconnect;
    etching the first interlayer dielectric according to a second trench interconnect pattern to expose a second end of the conductive gate resistor, the second end being distal from the first end; and
    depositing the third conductive material on the second end of the conductive gate resistor as a second trench interconnect coupling the second end of the conductive gate resistor to the first interconnect layer (M1) coupled to (Vdd).

13. The method of claim 12, further comprising:
    etching a second interlayer dielectric according to a zero via pattern to expose the second trench interconnect; and
    depositing the third conductive material on an exposed portion of the second trench interconnect as a zero via (V0) to couple the second trench interconnect to the first interconnect layer (M1).

14. The method of claim 10, further comprising:
    forming a shallow trench isolation (STI) region surrounding the semiconductor fin; and
    depositing a first interlayer dielectric (ILD) on the STI, the semiconductor fin and the conductive gate resistor.

15. The method of claim 10, in which depositing the first conductive material comprises depositing a high-K conductive material on the dielectric layer.

16. The method of claim 10, in which fabricating the conductive gate resistor comprises:
    etching the first interlayer dielectric according to a conductive resistor pattern; and
    depositing a titanium nitride according to the conductive resistor pattern as the conductive gate resistor.

17. The method of claim 10, further comprising integrating the decoupling capacitor into a mobile phone, a set top box, a music player, a video player, an entertainment unit, a navigation device, a computer, a hand-held personal communication systems (PCS) unit, a portable data unit, and/or a fixed location data unit.

18. A semiconductor device between a source voltage (Vss) and a power voltage (Vdd), comprising:
    a first terminal coupled to Vdd;
    means for capacitive decoupling coupled to the first terminal; and a second terminal comprising a conductive gate resistor coupled in series with the capacitive decoupling means, the second terminal coupled to Vss via a first interconnect layer (M1).

19. The semiconductor device of claim 18, in which the conductive gate resistor and the capacitive decoupling means are arranged in a middle-of-line (MOL) interconnect layer between a substrate supporting the capacitive decoupling means and the first interconnect layer (M1).

20. The semiconductor device of claim 18, in which the conductive gate resistor comprises titanium nitride.

21. The semiconductor device of claim 18, in which the first terminal comprises a substrate coupled to Vdd and supporting the capacitive decoupling means.

22. The semiconductor device of claim 18, further comprising:
a gate interconnect coupled to the capacitive decoupling means;
a first trench interconnect coupling a first end of the conductive gate resistor to the gate interconnect; and
a second trench interconnect coupling a second end of the conductive gate resistor to the first interconnect layer (M1) coupled to Vdd.

23. The semiconductor device of claim 22, in which the second trench interconnect is coupled to the first interconnect layer (M1) through a zero via (V0).

24. The semiconductor device of claim 22, further comprising:
a shallow trench isolation (STI) region surrounding the capacitive decoupling means; and
an interlayer dielectric (ILD) on the STI and at least the conductive gate resistor.

25. The semiconductor device of claim 18, integrated into a mobile phone, a set top box, a music player, a video player, an entertainment unit, a navigation device, a computer, a hand-held personal communication systems (PCS) unit, a portable data unit, and/or a fixed location data unit.

* * * * *

UNITED STATES PATENT AND TRADEMARK OFFICE
CERTIFICATE OF CORRECTION

PATENT NO. : 9,633,996 B1
APPLICATION NO. : 15/081396
DATED : April 25, 2017
INVENTOR(S) : Lixin Ge et al.

It is certified that error appears in the above-identified patent and that said Letters Patent is hereby corrected as shown below:

Claim 7, Column 15, Line 52 should read:
7. The semiconductor device of claim 1, in which the gate comprises a high-K metal gate (HKMG).

Claim 12, Column 16, Line 34 should read:
12. The method of claim 10, further comprising:
    etching the first interlayer dielectric according to a first trench interconnect pattern to expose a first end of the conductive gate resistor;
    depositing a third conductive material on the first end of the conductive gate resistor as a first trench interconnect coupling the first end of the conductive gate resistor to a gate interconnect;
    etching the first interlayer dielectric according to a second trench interconnect pattern to expose a second end of the conductive gate resistor, the second end being distal from the first end; and
    depositing the third conductive material on the second end of the conductive gate resistor as a second trench interconnect coupling the second end of the conductive gate resistor to the first interconnect layer (M1) coupled to power voltage (Vdd).

Signed and Sealed this
Sixth Day of June, 2017

Michelle K. Lee
*Director of the United States Patent and Trademark Office*